(12) United States Patent
Namazue

(10) Patent No.: US 11,952,024 B2
(45) Date of Patent: Apr. 9, 2024

(54) TRANSPORTATION FACILITY

(71) Applicant: Daifuku Co., Ltd., Osaka (JP)

(72) Inventor: Kazuya Namazue, Shiga (JP)

(73) Assignee: Daifuku Co., Ltd., Osaka (JP)

( * ) Notice: Subject to any disclaimer, the term of this patent is extended or adjusted under 35 U.S.C. 154(b) by 0 days.

(21) Appl. No.: 18/208,606

(22) Filed: Jun. 12, 2023

(65) Prior Publication Data

US 2024/0010251 A1 Jan. 11, 2024

(30) Foreign Application Priority Data

Jul. 8, 2022 (JP) .................................. 2022-110619

(51) Int. Cl.
*B61L 27/10* (2022.01)
*B61L 25/02* (2006.01)
*H01L 21/677* (2006.01)
*B61B 3/02* (2006.01)

(52) U.S. Cl.
CPC ............... *B61L 27/10* (2022.01); *B61L 25/02* (2013.01); *H01L 21/67727* (2013.01); *B61B 3/02* (2013.01); *B61L 2201/00* (2013.01)

(58) Field of Classification Search
CPC ...... B61L 27/10; B61L 25/02; B61L 2201/00; H01L 21/67727; B61B 3/02
See application file for complete search history.

(56) References Cited

U.S. PATENT DOCUMENTS

| 2021/0149401 A1* | 5/2021 | Kitamura .......... H01L 21/67727 |
| 2022/0089375 A1* | 3/2022 | Cho ........................ B65G 17/12 |
| 2022/0189328 A1* | 6/2022 | Evans ..................... B61L 27/10 |

FOREIGN PATENT DOCUMENTS

| JP | 2006-113967 A | 4/2006 |
| WO | 2018/110178 A1 | 6/2018 |

* cited by examiner

*Primary Examiner* — Sizo B Vilakazi

(74) *Attorney, Agent, or Firm* — Kaplan Breyer Schwarz, LLP

(57) ABSTRACT

A controller outputs, to a transport vehicle, a forward movement command for moving in the forward direction along a transport path toward a destination, and a reverse movement command for moving in a reverse direction along the transport path toward the destination. When a target task occurs, the controller determines a transport vehicle to execute the target task among a plurality of transport vehicles, while also including, as a candidate, a transport vehicle located on a downstream side of the transport path relative to the destination at a timing when the target task occurs.

7 Claims, 4 Drawing Sheets

TRANSPORTATION FACILITY

CROSS-REFERENCE TO RELATED APPLICATIONS

This application is based on and claims priority from Japanese Patent Application No. 2022-110619, filed on Jul. 8, 2022, with the Japan Patent Office, the disclosure of which is incorporated herein in its entirety by reference.

TECHNICAL FIELD

The present disclosure relates to a transportation facility.

BACKGROUND

Japanese Patent Laid-Open Publication No. 2006-113967 ('967 publication) discloses a transportation facility, which transports articles by allowing transport vehicles to travel among multiple transport target locations such as load ports and/or buffers. In this "Background" section, further descriptions are made below adopting the reference numerals used in the '967 publication.

In the facility of the '967 publication, in a specific area 48 where buffers 46c, 46d and a load port 44b are arranged in a front-rear direction along a path, a transport vehicle 6 transports an article among the buffers 46c, 46d and the load port 44b by repeating forward and backward movements (see, e.g., FIG. 4). In this facility, the transport vehicle 6, mostly moving only forward, is permitted to move backward under a predetermined condition to avoid circulating along the path to return to its original location, thereby enabling the transport vehicle 6 to travel in the reduced distance and efficiently execute an assigned task. This configuration may contribute to improving the transportation efficiency of the entire facility.

SUMMARY

A transportation facility according to the present disclosure includes: a plurality of transport vehicles that moves in a forward direction along a transport path set in advance, and transports an article; a plurality of transfer target locations arranged on the transport path, and each serving as a target location to/from which the article is transferred; and a controller that, when a task requiring a transport of the article by a transport vehicle occurs, outputs a movement command specifying one of the plurality of transfer target locations as a destination to each of the plurality of transport vehicles. The controller outputs, to each of the plurality of transport vehicles, a forward movement command for moving in the forward direction along the transport path toward the destination, and a reverse movement command for moving in a reverse direction along the transport path toward the destination. When a target task occurs as the task, the controller determines a transport vehicle to execute the target task among the plurality of transport vehicles, while also including, as a candidate, a transport vehicle located on a downstream side of the transport path relative to the destination at a timing when the target task occurs.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
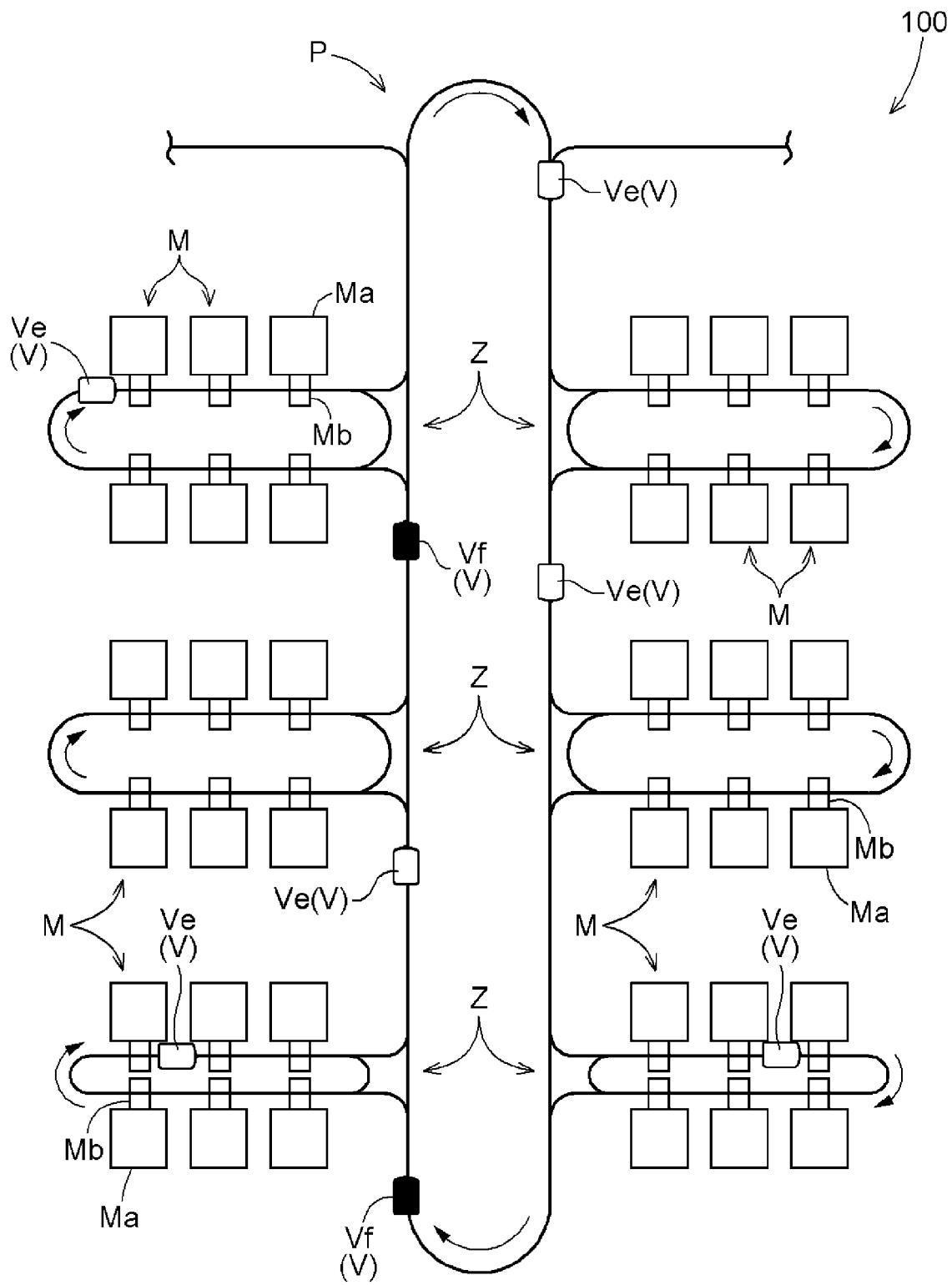
FIG. 1 is a plan view of a transportation facility.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

In the facility disclosed in the '967 publication, an execution order of multiple tasks is determined before the transport vehicle 6 enters the specific area 48, and then, the transport vehicle 6 executes the tasks. Thus, tasks to be executed in the specific area 48 are limited to those generated before the transport vehicle 6 enters the specific area 48. However, tasks that need to be executed by the transport vehicle 6 are not necessarily generated only before the transport vehicle 6 enters the specific area 48, but new tasks may frequently arise at various locations of a transport path for a transport vehicle traveling in the transport path. In the facility of the '967 publication, the transport vehicle 6 may not efficiently execute such frequently arising tasks, which makes it difficult to improve the transportation efficiency of articles in the entire facility.

In consideration of the circumstance, there is a demand for a technology capable of improving the transportation efficiency of articles in the entire facility in a case where new tasks frequently occur at various locations of the transport path.

A transportation facility according to the present disclosure includes: a plurality of transport vehicles that moves in a forward direction on a transport path set in advance, and transports an article; a plurality of transfer target locations arranged on the transport path, and each serving as a target location to/from which the article is transferred; and a controller that, when a task requiring a transport of the article by a transport vehicle occurs, outputs a movement command specifying one of the plurality of transfer target locations as a destination to each of the plurality of transport vehicles. The controller outputs, to each of the plurality of transport vehicles, a forward movement command for moving in the forward direction along the transport path toward the destination, and a reverse movement command for moving in a reverse direction along the transport path toward the destination. When a target task occurs as the task, the controller determines a transport vehicle to execute the target task among the plurality of transport vehicles, while also including, as a candidate, a transport vehicle located on a downstream side of the transport path relative to the destination at a timing when the target task occurs.

According to the configuration, the transport vehicle, which mostly moves in the forward direction along the transport path, may be moved in the reverse direction depending on a situation. Further, the controller may select not only a transport vehicle that is moving in the forward direction along the transport path, but also a transport vehicle that has already passed through the destination because of, for example, a late occurrence of the target task, as candidates to move toward the destination. Therefore, according to the present configuration, at the case where new tasks frequently occur at various locations of the transport path, more transport vehicles may be selected as candidates to move toward the destination, so that the transportation efficiency of articles may be improved in the entire facility.

Further features and advantages of the technology according to the present disclosure will be verified with illustrative and non-limiting embodiments, which are described herein below referring to the drawings.

Hereinafter, an embodiment of the transportation facility will be described with reference to the drawings.

Figure 2:
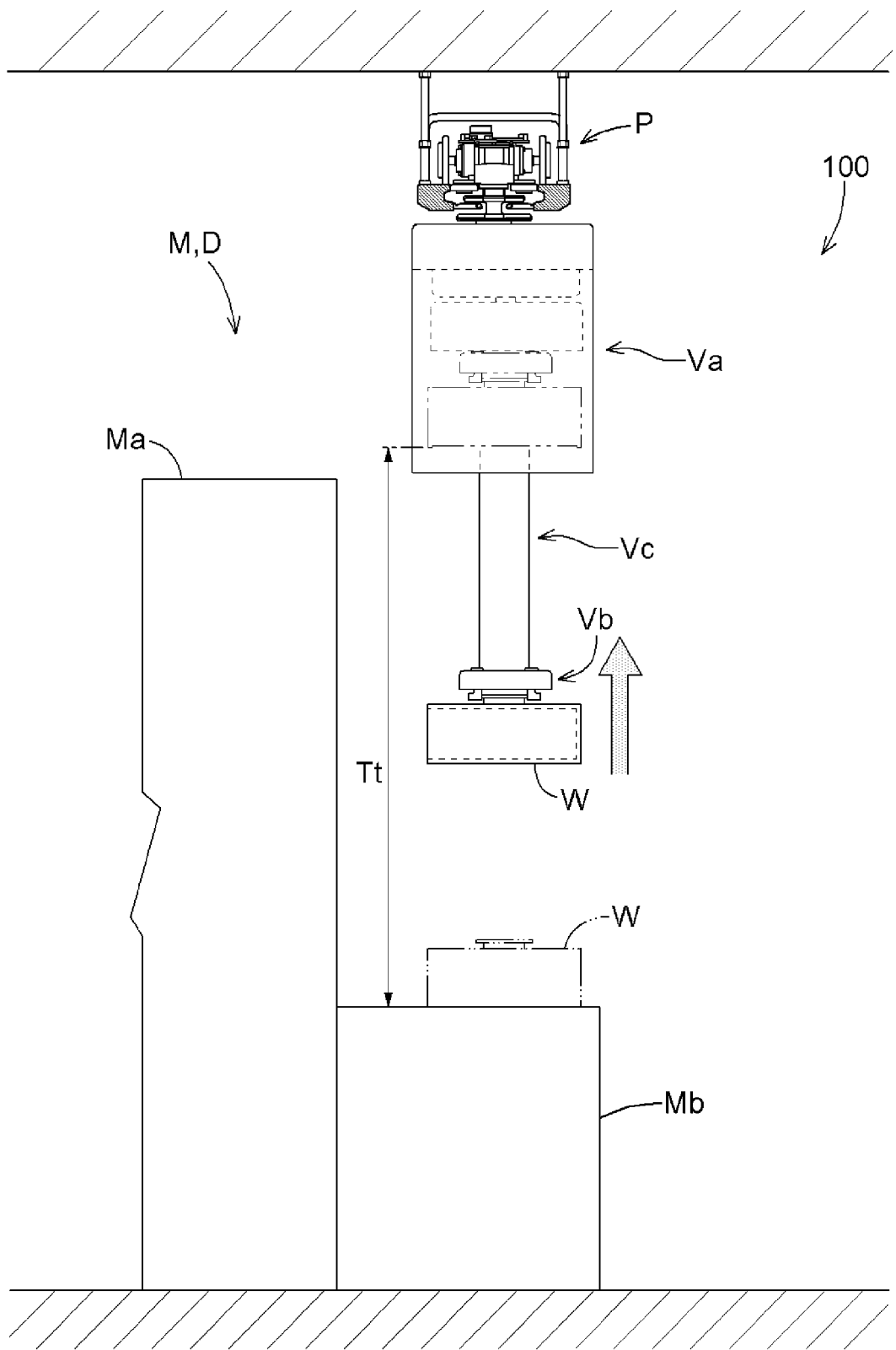
FIG. 2 is a view illustrating a state where an article is being transferred at a transfer target location.

As illustrated in FIGS. 1 and 2, a transportation facility 100 includes a plurality of transport vehicles V that moves along a predetermined transport path P in a forward direction F (see, e.g., FIG. 4) to transport an article W, and a plurality of transfer target locations M that is disposed at multiple locations of the transport path P and each serves as a target location to/from which an article W is transferred. Each of the plurality of transport vehicles V executes a task assigned to itself. In the transport path P, there co-exist empty transport vehicles Ve, which are unoccupied transport vehicles V that are not transporting articles W, and full transport vehicles Vf, which are transport vehicles V that are transporting articles W.

The transport path P includes linear and curved paths. In the present embodiment, the transportation facility 100 is provided with a branch-merge zone Z where the transport path P branches or merges.

The transfer facility 100 is used in, for example, a semiconductor manufacturing plant. In this case, each transfer target location M may be, for example, a processing apparatus Ma that performs a processing on an article W. The article W may be, for example, a front opening unified pod (FOUP) that accommodates wafers, or a reticle pod that accommodates reticles. When the article W is the FOUP, a wafer is an object to be processed by the processing apparatus Ma. When the article W is the reticle pod, a reticle is an object to be processed by the processing apparatus Ma. In the semiconductor manufacturing plant described as an example, the processing apparatus Ma performs various types of processing, such as a thin film formation, photolithography, and etching, on a semiconductor substrate. The processing apparatus Ma takes out a processing target object from an article W mounted on a mounting base Mb disposed adjacent to the processing apparatus Ma, and performs the processing on the processing target object. Each transport vehicle V transfers the article W with respect to the mounting base Mb.

As illustrated in FIG. 2, in the present embodiment, the transport vehicle V is configured as an overhead transport vehicle that travels along the transport path P set in the vicinity of the ceiling. The transport vehicle V includes an accommodation unit Va that accommodates an article W, a grasp unit Vb that grasps the article W, and a lift unit Vc that moves the grasp unit Vb up and down.

The transport vehicle V stops at the transfer target location M, and moves the grasp unit Vb up and down so as to transfer the article W between the accommodation unit Va and the mounting base Mb disposed below the accommodation unit Va. In the present embodiment, "transferring an article" includes taking an article W from the transfer target location M (the mounting base Mb) and delivering an article W to the transfer target location M (the mounting base Mb). FIG. 2 illustrates an example where the transport vehicle V is taking an article W mounted on the mounting base Mb. In the present embodiment, when the transport vehicle V transfers an article W from/to the transfer target location M, this transfer accompanies an operation of grasping or releasing the article W by the grasp unit Vb, and an operation of moving the grasp unit Vb up and down by the lift unit Vc. The sum of times when the operations are performed is a time required to transfer an article W (hereinafter, referred to as a "transfer time Tt").

Figure 5:
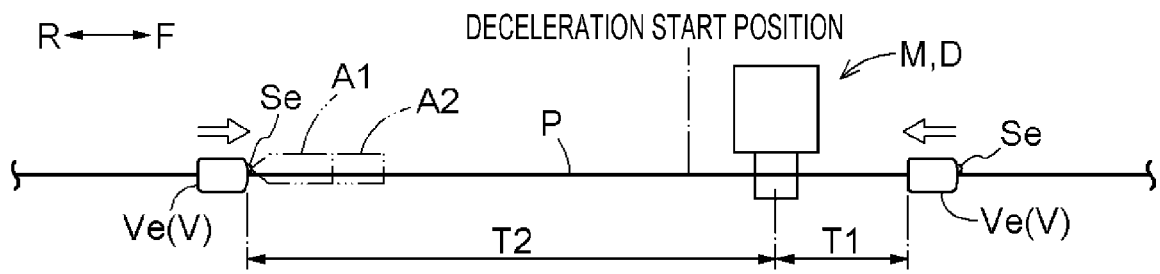
FIG. 5 is a view illustrating an example of a case where a reverse movement command is output.

As illustrated in FIG. 5, in the present embodiment, the transport vehicle V is equipped with a front vehicle detection sensor Se that detects another transport vehicle V present on the downstream side of the transport path P relative to the transport vehicle V (i.e., in front of the transport vehicle V). For example, when the front vehicle detection sensor Se detects another transport vehicle V traveling ahead, the transport vehicle V equipped with the front vehicle detection sensor Se, for example, reduces its travel speed or stops, so as to avoid a collision with the preceding transport vehicle V.

In the present embodiment, the front vehicle detection sensor Se may switch a detection range for detecting another transport vehicle V between a first range A1 selected during the normal travel of the transport vehicle V, and a second range A2 wider than the first range A1. Furthermore, for example, when the transport vehicle V equipped with the front vehicle detection sensor Se travels on the curved path, the front vehicle detection sensor Se may switch the detection range for detecting another transport vehicle V to, for example, a range narrower than the first range A1 (e.g., a third range). When the transport vehicle V travels on the curved path, the detection range of the front vehicle detection sensor Se is prone to direct toward the outside of the transport path P. In this case, by switching the detection range to the range narrower than the first range A1, it is possible to avoid the erroneous detection of unintended obstructions other than the transport vehicle V (e.g., structures making up a part of the transport path P).

Figure 3:
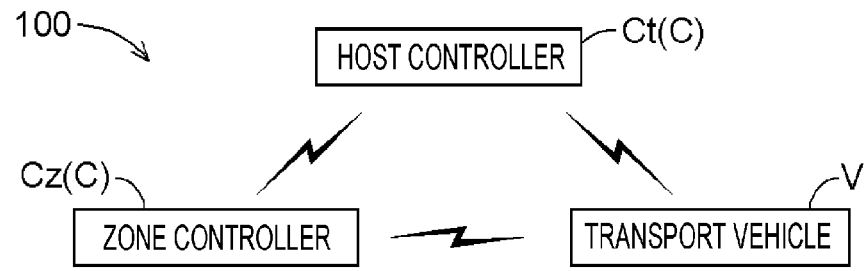
FIG. 3 is a control block diagram.

As illustrated in FIG. 3, the transportation facility 100 includes a control device C. When a task occurs requiring the transport of an article W by a transport vehicle V, the control device C outputs a movement command that specifies a transfer target location M related to the task as a destination D (see, e.g., FIG. 5), to each of the plurality of transport vehicles V.

In the present embodiment, the control device C includes a host controller Ct and a zone controller Cz. The host controller Ct, the zone controller Cz, and the transport vehicles V are capable of communicating with each other. The control device C, that is, the host controller Ct and the zone controller Cz each include, for example, a processor such as a microcomputer and peripheral circuits such as memories. Each process or function is implemented by the cooperation between the hardware components and programs executed on the processor such as a computer.

The host controller Ct may output a transport command that specifies a transport origin and a transport destination of an article W, to each of the plurality of transport vehicles V. The transport command includes the movement command described above. That is, the host controller Ct outputs the movement command that specifies the transfer target location M related to the task requiring the transport of an article W as the destination D, to each of the plurality of transport vehicles V.

Figure 4:
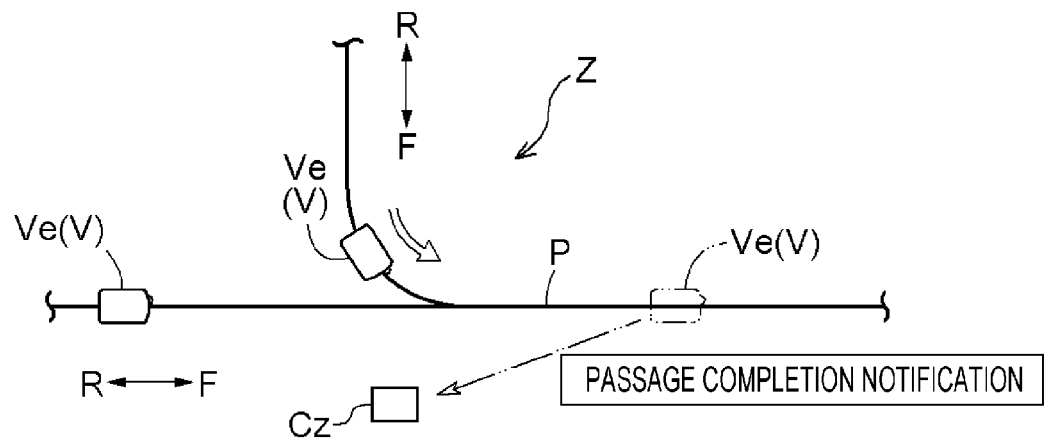
FIG. 4 is a view illustrating a control in a branch-merge zone.

As illustrated in FIG. 4, the zone controller Cz may control the transport vehicle V in the branch-merge zone Z. For example, directly in front of the branch-merge zone Z, the transport vehicle V requests for a permission to pass through the branch-merge zone Z, from the zone controller Cz. The zone controller Cz determines whether to permit the transport vehicle V making the request to pass through the branch-merge zone Z, based on, for example, the status of a plurality of transport vehicles V present near the branch-merge zone Z. The zone controller Ct transmits a permission signal to the transport vehicle V when the passage is permitted, and a stop signal when the passage is denied. The transport vehicle V that has received the permission signal enters the branch-merge zone Z, and the transport vehicle V that has received the stop signal waits directly in front of the branch-merge zone Z. As illustrated in FIG. 4, the transport vehicle V that has passed through the branch-merge zone Z makes a passage completion notification to the zone controller Cz, to report that the transport vehicle has passed through the branch-merge zone Z. As a result, the zone controller Cz may assign a permission to pass through the branch-merge zone Z, to the next transport vehicle V.

As illustrated in, for example, FIG. 5, the control device C (the host controller Ct in this embodiment) may output, to the transport vehicle V, a forward movement command for moving the transport vehicle V in the forward direction F along the transport path P toward the destination D, and a reverse movement command for moving the transport vehicle V in the reverse direction R along the transport path P toward the destination D.

The transport vehicle V that has received the forward movement command from the control device C moves in the forward direction F along the transport path P toward the destination D. The transport vehicle V that has received the reverse movement command moves in the reverse direction R along the transport path P toward the destination D. Here, the "forward direction F" refers to a regular movement direction, in which the transport vehicle V moves along the transport path P during ordinary times, and may also be referred to as a "forward movement direction." The "reverse direction R" is the opposite direction to the forward direction F, and may also be referred to as a "backward movement direction."

When a target task occurs as the task described above, the control device C determines a transport vehicle V to execute the target task among the plurality of transport vehicles V, while also including, as a candidate, even a transport vehicle V located on the downstream side of the transport path P relative to the destination D at the timing when the target task occurs. Thus, the control device C may select not only a transport vehicle V that is moving in the forward direction F along the transport path P, but also a transport vehicle V that has already passed through the destination D because of, for example, a late occurrence of the target task, as candidates to move toward the destination D. Therefore, when new tasks frequently occur at various locations of the transport path P, the number of transport vehicles V that may be selected as candidates to move toward the destination D may be increased, which thus makes it easy to improve the transportation efficiency of articles W in the entire facility.

In addition to a transport vehicle V located on the upstream side of the transport path P relative to the destination D at the occurrence timing of the target task, and a transport vehicle V located at the destination D at the occurrence timing of the target task, the candidates for a transport vehicle V to execute the target task also include a transport vehicle V located on the downstream side of the transport path P relative to the destination D at the occurrence timing of the target task. Further, when the target task occurs while a transport vehicle V is traveling very in front of the destination D, the transport vehicle V may not decelerate in time, and thus, may pass through the destination D.

In the present embodiment, as illustrated in FIG. 5, a deceleration start position is set directly in front of the destination D, to make the transport vehicle V stop appropriately at the destination D. When desiring to stop at the destination D, the transport vehicle V may start the deceleration at or directly in front of the deceleration start position, thereby stopping appropriately at the destination D. Meanwhile, even when the transport vehicle V starts the deceleration after having passed through the deceleration start position, the transport vehicle V may not stop appropriately at the destination D. That is, even when the target task occurs while the transport vehicle V is traveling very in front of the destination D, the transport vehicle V already passing through the deceleration start position at that time does not decelerate in time and passes through the destination D. The control device C selects even this transport vehicle V as a candidate for a transport vehicle V to execute the target task. That is, in the present embodiment, when determining a transport vehicle V to execute the target task among the plurality of transport vehicles V, the control device C includes, as a candidate for the transport vehicle V to execute the target task, a transport vehicle V that is located on the upstream side of the transport path P relative to the destination D at the occurrence timing of the target task, but is expected to stop at the downstream side relative to the destination D even after starting the deceleration from the occurrence timing of the target task.

In the present embodiment, the task assigned to the transport vehicle V includes retrieving an article W at the transfer target location M and transporting the retrieved article W to the destination D. For example, an article W that has been completely processed by the processing apparatus Ma is an object to be retrieved by the transport vehicle V. In this case, the timing when the processing by the processing apparatus Ma is terminated may be the timing when a task occurs.

After the occurrence of the target task, the control device C selects a plurality of transport vehicles V as candidates to execute the target task, and determines a transport vehicle V to execute the target task from the plurality of transport vehicles V selected as candidates.

As described above, in the present embodiment, since the task assigned to the transport vehicle V includes retrieving an article W at the transfer target location M and transporting the retrieved article W to the destination D, the task may not be executed by the full transport vehicle Vf that is already transporting an article W. Thus, in the present embodiment, the control device C selects available transport vehicles V (empty transport vehicles Ve) that are not transporting an article W, as candidates to execute the target task. Then, the control device C determines one empty transport vehicle Ve to execute the target task, from the plurality of empty transport vehicles Ve selected as candidates, and controls the determined empty transport vehicle Ve to move toward the destination D. The empty transport vehicle Ve to execute the target task is determined based on a predetermined condition.

Detailed descriptions will be made with reference to FIGS. 5 to 7. In the descriptions herein below, a passing transport vehicle Ve refers to an empty transport vehicle Ve that has passed through the destination D, and an unarrived transport vehicle Ve refers to an empty transport vehicle Ve that is moving on the upstream side of the transport path P relative to the passing transport vehicle Ve and has not yet arrived at the destination D. Further, as described above, a transport vehicle V that is transporting an article W is referred to as a full transport vehicle Vf. A full transport vehicle Vf that has not yet arrived at the destination D is referred to as an unarrived full transport vehicle VP Here, the reference marks "Ve" and "Vf" will be used distinguishably depending on whether a transport vehicle V is an empty transport vehicle Ve that is not transporting an article W or a full transport vehicle Vf that is transporting an article W. Accordingly, as described above, "Ve" will denote a passing transport vehicle and an unarrived transport vehicle, which are empty transport vehicles, and "Vf" will denote an unarrived full transport vehicle, which is a full transport vehicle Vf.

As illustrated in FIG. 5, the control device C may calculate a first required time T1, during which a passing transport vehicle Ve moves in the reverse direction R and arrives at the destination D, and a second required time T2, during which an unarrived transport vehicle Ve moves in the forward direction F and arrives at the destination D. In the present embodiment, the control device C calculates the second required time T2 for an unarrived transport vehicle Ve located closest to the destination D among unarrived transport vehicles Ve.

The first required time T1 is calculated, for example, by dividing the distance from the current position of the passing transport vehicle Ve to the destination D by the speed (average speed), at which the passing transport vehicle Ve moves in the reverse direction R. The second required time T2 is calculated, for example, by dividing the distance from the current position of the unarrived transport vehicle Ve to the destination D by the speed (average speed), at which the unarrived transport vehicle Ve moves in the forward direction F. For example, the speed at which the passing transport vehicle Ve moves in the reverse direction R is set to be lower than the speed at which the unarrived transport vehicle Ve moves in the forward direction F. The required time likely lengthens as the speed is low, and likely shortens as the speed is high.

When the first required time T1 is shorter than the second required time T2, the control device C outputs the reverse movement command for moving the passing transport vehicle Ve toward the destination D. That is, in this case, the control device C determines the passing transport vehicle Ve to be a transport vehicle V to execute the target task. When the first required time T1 is longer than the second required time T2, the control device C outputs the forward movement command for moving the unarrived transport vehicle Ve toward the destination D. That is, in this case, the control device C determines the unarrived transport vehicle Ve to be a transport vehicle V to execute the target task. As a result, the transport vehicle V with the shortest time required until arriving at the destination D may be moved toward the destination D, so that the transportation efficiency of the entire facility may easily be improved. FIG. 5 illustrates a state where the control device C outputs the reverse movement command to the passing transport vehicle Ve, and the passing transport vehicle Ve is moving in the reverse direction R along the transport path P toward the destination D.

As described above, the detection range of the front vehicle detection sensor Se that detects another transport vehicle V traveling ahead is set to the first range A1 during ordinary times. In the present embodiment, when the reverse movement command is output to the passing transport vehicle Ve, the control device C sets the detection range of the front vehicle detection sensor Se equipped in a following transport vehicle V located on the upstream side of the transport path P relative to the passing transport vehicle Ve, to the second range A2. When the preceding transport vehicle V travels in the opposite direction to the following transport vehicle V, the relative speed becomes higher than that when both the vehicles travel in the same direction. However, as described above, when the detection range of the front vehicle detection sensor Se equipped in the following transport vehicle V (the unarrived transport vehicle Ve in the example of FIG. 5) is changed from the first range A1 to the second range A2, the preceding passing transport vehicle V may be detected earlier. Accordingly, even without reducing the movement speeds of both the preceding and following transport vehicles V, it is possible to secure a time to perform a control for avoiding the interference between the vehicles.

Here, an unarrived full transport vehicle Vf is transporting an article W, and executing its assigned task. Thus, from the viewpoint of improving the transportation efficiency of the entire facility, it is desirable not to hinder the movement of the unarrived full transport vehicle Vf. Accordingly, when the reverse movement command is output to the passing transport vehicle Ve, a condition may be added, which provides that the passing transport vehicle Ve moving by the reverse movement command does not hinder the unarrived full transport vehicle Vf Detailed descriptions are made below.

Figure 6:
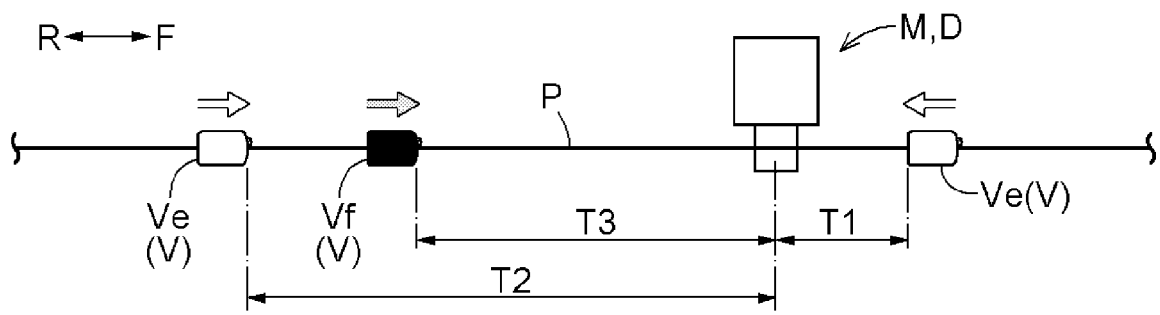
FIG. 6 is a view illustrating an example of a case where a reverse movement command is output.

As illustrated in FIG. 6, in the present embodiment, the control device C may calculate a third required time T3, during which an unarrived full transport vehicle Vf located closest to the destination D among unarrived full transport vehicles Vf moves in the forward direction F and arrives at the destination D.

The third required time T3 is calculated, for example, by dividing the distance from the current position of the unarrived full transport vehicle Vf to the destination D by the speed (average speed), at which the unarrived full transport vehicle Vf moves in the forward direction F.

When the first required time T1 is shorter than the second required time T2, the control device C outputs the reverse movement command for moving the passing transport vehicle Ve toward the destination D, with a condition that a time obtained by adding the first required time T1 to a time required to transfer an article W at the transfer target location M (the destination D) (the "transfer time Tt" described above; see, e.g., FIG. 2) related to the target task is shorter than the third required time T3. As a result, during the time until the unarrived full transport vehicle Vf arrives at the destination D, the passing transport vehicle Ve may move toward the destination D, and finish the transfer of the article W at the destination D. Thus, the movement of the unarrived full transport vehicle Vf may not be hindered.

Meanwhile, even when the first required time T1 is shorter than the second required time T2, the control device C does not output the reverse movement command to the passing transport vehicle Ve, in a case where the time obtained by adding the first required time T1 to the transfer time Tt at the transfer target location M (the destination D) related to the target task is longer than the third required time T3. In this case, the control device C selects a new candidate to execute the target task.

Here, as described above referring to FIG. 4, the zone controller Cz communicates with the plurality of transport vehicles V and thereby controls transport vehicles V in the branch-merge zone Z based on, for example, the status of the plurality of transport vehicles V present near the branch-merge zone Z. Further, in the present embodiment, a transport vehicle V that has passed through the branch-merge zone Z makes the passage completion notification to the zone controller Cz, to report that the transport vehicle V has passed through the branch-merge zone Z. For this reason, it is not desirable to move the transport vehicle V that has passed through the branch-merge zone Z, in the reverse direction R, because the control may become complicated, and the control load may increase. Even in terms of the structure of the transport path P in the branch-merge zone Z, it may not also be desirable to move the transport vehicle V in the reverse direction R in the branch-merge zone Z.

Figure 7:
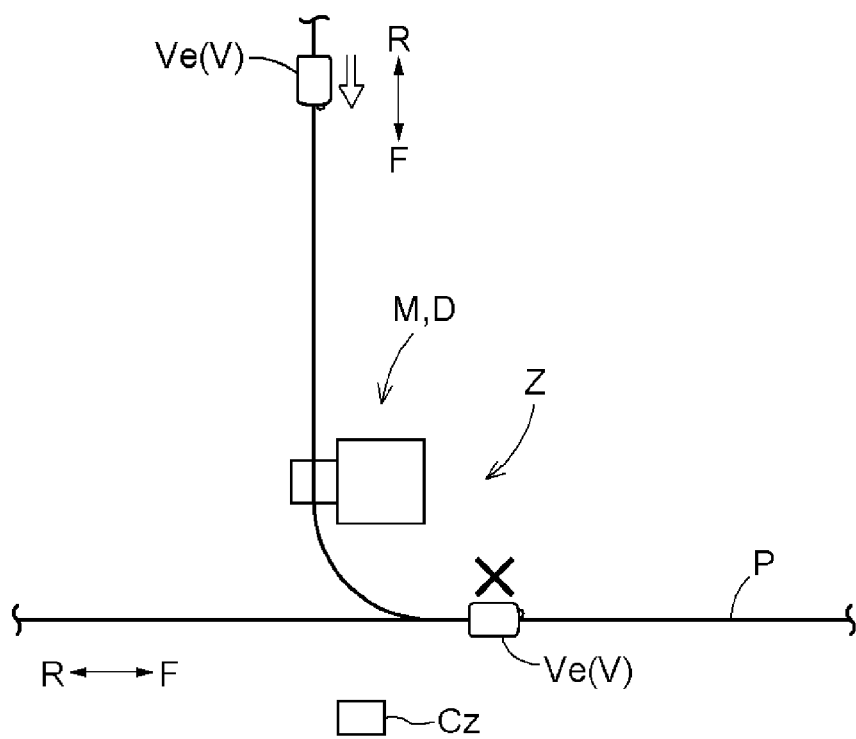
FIG. 7 is a view illustrating an example of a case where a reverse movement command is prohibited.

As illustrated in FIG. 7, in the present embodiment, when the branch-merge zone Z is disposed between a passing transport vehicle Ve and the destination D on the transport path P, the control device C excludes the passing transport vehicle Ve from candidates for a transport vehicle V to execute the target task. Further, the control device C also excludes a passing transport vehicle Ve that has passed through the entrance of the branch-merge zone Z, but has not yet passed through the exit of the branch-merge zone Z, from candidates for a transport vehicle V to execute the target task. That is, even when the first required time T1 of the passing transport vehicle Ve is shorter than the second required time T2 of the unarrived transport vehicle Ve, the control device C excludes the passing transport vehicle Ve from candidates to execute the target task, in the case described above. This configuration may not complicate the control of the branch-merge zone Z by the zone controller Cz. Further, the transport vehicle V may be prohibited from moving in the reverse direction R in the branch-merge zone Z where it is inappropriate to move the transport vehicle V in the reverse direction R. Further, when the destination D is located inside the branch-merge zone Z, the control device C also excludes the passing transport vehicle Ve that has passed through the destination D, from candidates to execute the target task.

Figure 8:
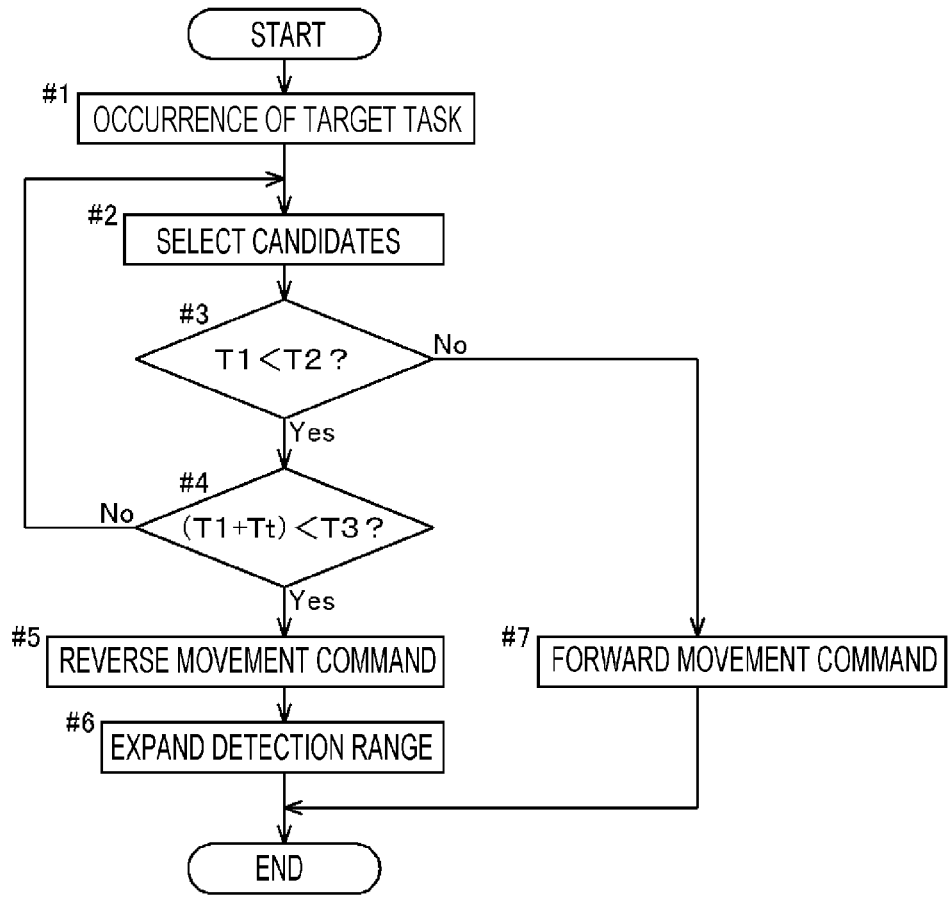
FIG. 8 is a flowchart.

Next, the flow of the control will be described with reference to the flowchart of FIG. 8.

When the target task occurs (step #1), the control device C selects candidates to execute the target task from the plurality of transport vehicles V (step #2).

After step #2, the control device C determines whether the first required time T1, during which the passing transport vehicle Ve moves in the reverse direction R and arrives at the destination D, is shorter than the second required time T2, during which the unarrived transport vehicle Ve moves in the forward direction F and arrives at the destination D (step #3). When it is determined that the first required time T1 is shorter than the second required time T2 (step #3: Yes), the control device C determines whether the time obtained by adding the first required time T1 to the transfer time Tt at the transfer target location M (the destination D) related to the target task is shorter than the third required time T3 (step #4). When it is determined that the time obtained by adding the first required time T1 to the transfer time Tt is shorter than the third required time T3 (step #4: Yes), the control device C outputs the reverse movement command to the passing transport vehicle Ve (step #5). Then, the control device C causes the passing transport vehicle Ve to execute the target task. When it is determined in step #4 that the time obtained by adding the first required time T1 to the transfer time Tt is not shorter than the third required time T3 (step #4: No), the control device C selects a new candidate to execute the target task (step #2).

Simultaneously with or after step #5, the control device C expands the detection range of the front vehicle detection sensor Se equipped in the unarrived transport vehicle Ve following the passing transport vehicle Ve, from the first range A1 to the second range A2 (step #6). After the passing transport vehicle Ve finishes the movement in the reverse direction R, the control device C returns the detection range of the front vehicle detection sensor Se equipped in the following unarrived transport vehicle Ve to the first range A1 from the second range A2.

When it is determined in step #3 that the first required time T1 is not shorter than the second required time T2 (step #3: No), the control device C outputs the forward movement command to the following unarrived transport vehicle Ve (step #7). Then, the control device C causes the following unarrived transport vehicle Ve to execute the target task.

Other Embodiments

Next, other embodiments of the transportation facility will be described.

(1) In the embodiment described above, for example, the task assigned to the transport vehicle V includes retrieving an article W at the transfer target location M and transporting the retrieved article W to the destination D. However, without being limited to this embodiment, the task assigned to the transport vehicle V may relate to transporting an article W to the transfer target location M. In this case, the full transport vehicle Vf, which is a transport vehicle V that is transporting an article W, becomes a candidate to execute the target task.

(2) In the embodiment described above, for example, when the first required time T1 is shorter than the second required time T2, the control device C outputs the reverse movement command to the passing transport vehicle Ve, with the condition that the time obtained by adding the first required time T1 to the transfer time Tt at the transfer target location M (the destination D) of the target task is shorter than the third required time T3. However, without being limited to this embodiment, the control device C may output the reverse movement command to the passing transport vehicle Ve, regardless of any condition, as long as the first required time T1 is shorter than the second required time T2. When the following unarrived full transport vehicle Vf is likely to arrive at the destination D in the meantime, the unarrived full transport vehicle Vf may be caused to wait directly in front of the destination D until the passing transport vehicle Ve finishes the transfer of an article W at the destination D.

(3) In the embodiment described above, for example, in order to alleviate the control load in the branch-merge zone Z, the control device C excludes the passing transport vehicle Ve from candidates to execute the target task, when the branch-merge zone Z is located between the passing transport vehicle Ve and the destination D on the transport path P. However, without being limited to this embodiment, even in the case above, the control device C may select the passing transport vehicle Ve as a candidate to execute the target task. In this case, when the passing transport vehicle Ve that has passed through the branch-merge zone Z moves in the reverse direction R and enters the branch-merge zone Z again, the passing transport vehicle Ve may make the passage permission request and the passage completion notification again to the zone controller Cz.

(4) In the embodiment described above, the processing apparatus Ma that performs a processing on an article W is described as an example of the transfer target location M.

However, without being limited to this embodiment, the transfer target location M may be a buffer where an article W is temporarily mounted or a place where a deliver is performed with respect to various transport machines.

(5) In the embodiment above, for example, the transport vehicle V is configured as an overhead transport vehicle that travels along the transport path P set in the vicinity of the ceiling. However, without being limited to this embodiment, the transport vehicle V may be, for example, a tracked or trackless unmanned transport vehicle that travels on a floor surface. In this case, the transfer of an article W is performed using, for example, a conveyor or an arm with respect to the transfer target location M disposed at the same height as the transport vehicle V traveling on the floor surface.

(6) The configuration of the embodiment described above may be applied in combination with the configurations disclosed in other embodiments within the scope that does not cause any inconsistency. The embodiments disclosed herein are merely examples in all respects, and therefore, various improvements and/or modifications may be appropriately made thereto within the scope that does not depart from the gist of the present disclosure.

Outline of Embodiments

The transportation facility described above is described below.

A transportation facility including:
a plurality of transport vehicles each configured to move in a forward direction along a transport path set in advance, and transport an article;
a plurality of transfer target locations arranged on the transport path, and each configured to serve as a target location to/from which the article is transferred; and
a controller configured to, when a task requiring a transport of the article by a transport vehicle occurs, output a movement command specifying one of the plurality of transfer target locations as a destination to each of the plurality of transport vehicles,
in which the controller outputs, to each of the plurality of transport vehicles, a forward movement command for moving in the forward direction along the transport path toward the destination, and a reverse movement command for moving in a reverse direction along the transport path toward the destination, and
when a target task occurs as the task, the controller determines a transport vehicle to execute the target task among the plurality of transport vehicles, while also including, as a candidate, a transport vehicle located on a downstream side of the transport path relative to the destination at a timing when the target task occurs.

According to the configuration, the transport vehicle, which mostly moves in the forward direction along the transport path, may be moved in the reverse direction depending on a situation. Further, the controller may select not only a transport vehicle that is moving in the forward direction along the transport path, but also a transport vehicle that has already passed through the destination because of, for example, a late occurrence of the target task, as candidates to move toward the destination. Therefore, according to the present configuration, when new tasks frequently occur at various locations of the transport path, more transport vehicles may be selected as candidates to move toward the destination, so that the transportation efficiency of articles may be improved in the entire facility.

When determining the transport vehicle to execute the target task among the plurality of transport vehicles, the controller also includes, as the candidate, a transport vehicle that is located on an upstream side of the transport path relative to the destination at the timing when the target task occurs, but is expected to stop at the downstream side relative to the destination even after starting a deceleration from the timing when the target task occurs.

According to the configuration, the controller may determine a transport vehicle to execute the target task, while also including, as a candidate, a transport vehicle that is expected to stop at the downstream side relative to the destination even after starting the deceleration from the occurrence timing of the target task, so that the transportation efficiency of articles may be further improved in the entire facility.

The task includes retrieving the article at a transfer target location and transporting the retrieved article to the destination, and
the controller selects an empty transport vehicle that is not transporting the article, as the candidate.

According to the configuration, the controller may appropriately select an empty transport vehicle capable of executing the task, and cause the transport vehicle to execute the target task.

When the empty transport vehicle that has passed the destination is referred to as a passing transport vehicle, and the empty transport vehicle that is moving on the upstream side of the transport path relative to the passing transport vehicle and has not yet arrived at the destination is referred to as an unarrived transport vehicle,
the controller is configured to calculate a first required time during which the passing transport vehicle moves in the reverse direction and arrives at the destination, and a second required time during which the unarrived transport vehicle moves in the forward direction and arrives at the destination, and
when the first required time is shorter than the second required time, the controller outputs the reverse movement command for moving the passing transport vehicle toward the destination, and when the first required time is longer than the second required time, the controller outputs the forward movement command for moving the unarrived transport vehicle toward the destination.

According to the configuration, a transport vehicle with the shortest time required until arriving at the destination may be moved toward the destination. Therefore, the transportation efficiency of the entire facility may easily be improved.

When the transport vehicle that is transporting the article is referred to as a full transport vehicle, and the full transport vehicle that has not yet arrived at the destination is referred to as an unarrived full transport vehicle,
the controller is configured to calculate a third required time during which the unarrived full transport vehicle closest to the destination among a plurality of unarrived full transport vehicles moves in the forward direction and arrives at the destination, and
when the first required time is shorter than the second required time, the controller outputs the reverse movement command for moving the passing transport vehicle toward the destination, with a condition that a time obtained by adding the first required time to a time required to transfer the article at the transfer target location related to the target task is shorter than the third required time.

When the first required time, during which the passing transport vehicle moves in the reverse direction and arrives at the destination, is shorter than the second required time, during which the unarrived transport vehicle moves in the forward direction and arrives at the destination, the passing transport vehicle arrives at the destination earlier than the unarrived transport vehicle. However, when an unarrived full transport vehicle other than the unarrived transport vehicle passes through the destination during the time until the passing transport vehicle arrives at the destination and finishes the transfer of an article, the unarrived full transport vehicle and the passing transport vehicle may interfere with each other. In order to avoid this interference, the unarrived full transport vehicle needs to wait on the upstream side of the transport path relative to the destination, which may delay the transportation schedule of the unarrived full transport vehicle. According to the present configuration, when outputting the reverse movement command for moving the passing transport vehicle toward the destination, the controller sets the condition that the time obtained by adding the first required time to the time required to transfer an article at the transfer target location related to the target task is shorter than the third required time, during which the unarrived full transport vehicle moves in the forward direction and arrives at the destination, in addition to the condition that the first required time is shorter than the second required time. Therefore, it is possible to reduce the likelihood that the output of the reverse movement command will affect the movement of the unarrived full transport vehicle following the passing transport vehicle.

The transport path includes a branch-merge zone, in which the transport path branches or merges, and when the branch-merge zone is located between the passing transport vehicle and the destination on the transport path, the controller excludes the passing transport vehicle from the candidate.

In the branch-merge zone, the transport vehicle may not be moved in the reverse direction in terms of the structure of the transport path, and even when the movement of the transport vehicle in the reverse direction is possible, the control for avoiding the interference of multiple transport vehicles may become complicated. That is, from the viewpoint of the structure and the control, it may not be advantageous to move the transport vehicle in the reverse direction. According to the present configuration, the passing transport vehicle capable of moving in the reverse direction in the branch-merge zone is excluded in the candidate to move toward the destination, so that the problem described above may be avoided.

The transport vehicle is equipped with a front vehicle detection sensor that detects another transport vehicle present on the downstream side of the transport path relative to the transport vehicle, the front vehicle detection sensor is capable of switching a detection range for detecting another transport vehicle between a first range selected during a normal travel of the transport vehicle and a second range wider than the first range, and when outputting the reverse movement command to the passing transport vehicle, the controller sets the detection range of the front vehicle detection sensor equipped in a following transport vehicle present on the upstream side of the transport path relative to the passing transport vehicle to the second range.

When a preceding transport vehicle travels in the opposite direction to a following transport vehicle, the relative speed becomes higher than that when both the vehicles travel in the same direction. According to the present configuration, when outputting the reverse movement command to the passing transport vehicle, the controller sets the detection range of the front vehicle detection sensor equipped in the following transport vehicle located on the upstream side of the transport path relative to the passing transport vehicle to the second range wider than the first range selected during the normal travel. As a result, the following transport vehicle may detect the preceding passing transport vehicle earlier. Therefore, even without reducing the travel speeds of both the preceding and following transport vehicles, it is possible to secure a time to perform a control for avoiding the interference between both the vehicles.

The technology according to the present disclosure may be used for a transportation facility.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A transportation facility comprising:
a plurality of transport vehicles each configured to move in a forward direction along a transport path set in advance, and transport an article;
a plurality of transfer target locations arranged on the transport path, and each configured to serve as a target location to/from which the article is transferred; and
a controller configured to, when a task requiring a transport of the article by a transport vehicle occurs, output a movement command specifying one of the plurality of transfer target locations as a destination to each of the plurality of transport vehicles,
wherein the controller outputs, to each of the plurality of transport vehicles, a forward movement command for moving in the forward direction along the transport path toward the destination, and a reverse movement command for moving in a reverse direction along the transport path toward the destination, and
when a target task occurs as the task, the controller determines a transport vehicle to execute the target task from among the plurality of transport vehicles as candidates to execute the target task, while also including, as one of the candidates to execute the target task, a transport vehicle located on a downstream side of the transport path relative to the destination, at a timing when the target task occurs.

2. The transportation facility according to claim 1, wherein when determining the transport vehicle to execute the target task among the plurality of transport vehicles, the controller also includes, as one of the candidates, a transport vehicle that is located on an upstream side of the transport path relative to the destination at the timing when the target task occurs, and which is expected to stop at the downstream side relative to the destination, even after starting a deceleration from the timing when the target task occurs.

3. The transportation facility according to claim 1, wherein the task includes retrieving the article at a transfer target location and transporting the retrieved article to the destination, and
the controller selects an empty transport vehicle that is not transporting the article, as the candidate.

4. The transportation facility according to claim 3, wherein when the empty transport vehicle that has passed the destination is referred to as a passing transport vehicle, and the empty transport vehicle that is moving on the upstream side of the transport path relative to the passing transport vehicle and has not yet arrived at the destination is referred to as an unarrived transport vehicle, the controller is configured to calculate a first required time during which the passing transport vehicle moves in the reverse direction and arrives at the destination, and a second required time during which the unarrived transport vehicle moves in the forward direction and arrives at the destination, and when the first required time is shorter than the second required time, the controller outputs a reverse movement command for moving the passing transport vehicle in the reverse direction toward the destination, and when the first required time is longer than the second required time, the controller outputs a forward movement command for moving the unarrived transport vehicle in the forward direction toward the destination.

5. The transportation facility according to claim 4, wherein when the transport vehicle that is transporting the article is referred to as a full transport vehicle, and the full transport vehicle that has not yet arrived at the destination is referred to as an unarrived full transport vehicle, the controller is configured to calculate a third required time during which the unarrived full transport vehicle closest to the destination among a plurality of unarrived full transport vehicles moves in the forward direction and arrives at the destination, and when the first required time is shorter than the second required time, the controller outputs the reverse movement command for moving the passing transport vehicle toward the destination, with a condition that a time obtained by adding the first required time to a time required to transfer the article at the transfer target location related to the target task is shorter than the third required time.

6. The transportation facility according to claim 4, wherein the transport path includes a branch-merge zone, in which the transport path branches or merges, and when the branch-merge zone is located between the passing transport vehicle and the destination on the transport path, the controller excludes the passing transport vehicle as one of the candidates.

7. The transportation facility according to claim 4, wherein the transport vehicle is equipped with a front vehicle detection sensor that detects another transport vehicle present on the downstream side of the transport path relative to the transport vehicle, the front vehicle detection sensor is capable of switching a detection range for detecting another transport vehicle between a first range selected during a normal travel of the transport vehicle and a second range wider than the first range, and when outputting the reverse movement command to the passing transport vehicle, the controller sets the detection range of the front vehicle detection sensor equipped in a following transport vehicle present on the upstream side of the transport path relative to the passing transport vehicle to the second range.

* * * * *